United States Patent [19]

Tasaki et al.

[11] Patent Number: 4,965,580
[45] Date of Patent: Oct. 23, 1990

[54] QUANTIZER AND INVERSE-QUANTIZER

[75] Inventors: Hirohisa Tasaki; Kunio Nakajima, both of Kanagawa, Japan

[73] Assignee: Mitsubishi Denki Kabushiki Kaisha, Tokyo, Japan

[21] Appl. No.: 405,350

[22] Filed: Sep. 11, 1989

[30] Foreign Application Priority Data

Sep. 26, 1988 [JP] Japan .................................. 63-242001
Sep. 28, 1988 [JP] Japan .................................. 63-243201

[51] Int. Cl.⁵ ........................ H03M 7/36; H04N 7/137
[52] U.S. Cl. .................................... 341/200; 341/106; 358/135
[58] Field of Search ........................ 341/200, 106, 118; 358/135, 136, 133

[56] References Cited

U.S. PATENT DOCUMENTS

| | | | |
|---|---|---|---|
| 4,639,778 | 1/1987 | Yamaguchi et al. ................. | 358/135 |
| 4,670,851 | 6/1987 | Murakami et al. ............. | 358/136 X |
| 4,725,885 | 2/1988 | Gonzales et al. .................... | 358/135 |
| 4,807,250 | 2/1989 | Tanaka .............................. | 341/155 X |
| 4,860,313 | 8/1989 | Shpiro .............................. | 358/136 X |
| 4,862,173 | 8/1989 | Nishitani ............................ | 341/200 |

FOREIGN PATENT DOCUMENTS 0042940 2/1989 Japan .................... 341/200

Primary Examiner—William M. Shoop, Jr.
Assistant Examiner—Sharon D. Logan
Attorney, Agent, or Firm—Wolf, Greenfield & Sacks

[57] ABSTRACT

In a quantizer of the invention, a quantization distortion in the case where the optimum vector code word was used and a quantization distortion in the case where the optimum predictive error vector code word was used, are compared by comparing means, thereby selecting which one of the conventional vector quantization and the predictive error vector quantization should be executed for the present input vector. On the other hand, an inverse-quantizer selects which one of the inverse-quantizations should be executed on the basis of the input code number from the vector code. According to the invention, further, the quantizer and inverse-quantizer have the same analyzing means and converting means and execute the adaptation of the code tables by using the quantization results. Thus, the adaptation of the code table of the quantizer and inverse-quantizer can be accomplished without, particularly, adding the information transmitting process for adaptation. On the other hand, by executing the quantization by selectively using the predictive error vector quantizing means, the accuracy of the quantization result is improved and the adaptation of good code tables is realized.

3 Claims, 6 Drawing Sheets

QUANTIZER AND INVERSE-QUANTIZER

BACKGROUND OF THE INVENTION

1. Field of the Invention

The present invention relates to a quantizer for compressing an information amount by using a code table having a limited number (N) of code words and also relates to an inverse-quantizer.

2. Description of the Prior Art

As a system for compressing an input vector such as a parameter indicative of a voice frequency spectral feature, figure pattern, or the like into a small information amount, a vector quantizing method has been known whereby a code table having a limited number (N) of code words is prepared, the code word which is closest to the input vector is selected from among the N code words, and the input vector is expressed by only the code number. According to the above vector quantizing method, the information amount can be fairly effectively compressed for the input vector such as a voice spectral feature parameter, figure information, or the like in which there is the correlation among the components in the vector. Typical examples of the quantizer and inverse-quantizer using the conventional vector quantizing method can be seen in FIGS. 2 and 3 of the following literature 1.

A. Buzo, A. H. Gray, Jr., R. M. Gray and J. D. Markel, "Speech Coding Based upon Vector Quantization", IEEE Transactions on ASSP, Vol. 28, No. 5, pp. 562–574, 1980.

In the literature 1, the input voice signal is expressed by a vocal sound vector indicative of the frequency spectral feature, amplitude information, pitch period, and voiced sound/voiceless sound information, the information amount of the vocal sound vector is compressed by using the vector quantizing method, and the other information amounts are compressed by using a one-dimensional vector quantizing method, that is, a scalar quantizing method. FIGS. 5 and 6 show constructions of a quantizer and an inverse-quantizer for executing the quantization and inverse-quantization of the vocal sound vector (hereinafter referred to as an input vector) and amplitude information which have been disclosed in the literature 1. In the diagrams, reference numeral 1 denotes an input vector input terminal; 2 indicates an amplitude information input terminal; 3 and 23 code tables each comprising the limited number (N) of code words; 6 vector quantizing means; 10 amplitude information quantizing means; 11 a code number transmission path; 12 a quantization amplitude information transmission path; 26 an inverse-vector quantizing means; 28 an amplitude information inverse-quantizing means; 29 an output vector output terminal; and 30 an amplitude information output terminal.

The operation of the above conventional example will be described. First, an input vector X is inputted to the vector quantizing means 6 in the quantizer through the input vector input terminal 1. The vector quantizing means 6 calculates the distances $\{d(X, C_i) | i=1, \ldots, N\}$ between the input vector X and the N code words $\{C_i | i=1, \ldots, N\}$ in the code table 3, respectively, and outputs the code number of the optimum vector code word which gives the minimum distance among them to the inverse-vector quantizing means 26 in the inverse-quantizer through the code number transmission path 11. The distance function d defines the evaluation degree of the vector quantization distortion and the absolute value distance, Euclid distance, or the like is used. The inverse-vector quantizing means 26, outputs the code word which is designated by the code number inputted from the code table 23 through the output vector output terminal 29. At this time, the above minimum distance corresponds to the quantization distortion of the quantizer/inverse-quantizer to the present input vector. As its value is small, the quantizer/inverse-quantizer can be regarded to be good. On the other hand, the amplitude information is inputted to the amplitude information quantizing means 10 in the quantizer through the amplitude information input terminal 2. The amplitude information quantizing means 10 quantizes the input amplitude information and outputs the result to the amplitude information inverse-quantizing means 28 in the inverse-quantizer through the quantization amplitude information transmission path 12. The amplitude information inverse-quantizing means 28 inverse-quantizes the amplitude information and outputs the result through the amplitude information output terminal 30.

The characteristic which is required for the quantizer/inverse-quantizer is such that the average quantization distortion is minimized for various input series. A consideration will now be made with respect to the case where the vocal sound vector of a voice and figure pattern information are used as an input series. For those input vectors, there are two cases where they greatly change and where they are relatively stable when they are monitored with the elapse of time. However, so long as they are relatively stable, the conventional quantizer/inverse-quantizer are not the optimum quantizer/inverse-quantizer which gives the minimum quantization distortion. As a system for realizing the further smaller average quantization distortion as compared with that in the conventional quantizer/inverse-quantizer, there quantizer/inverse-quantizer have been known which use the predictive error vector quantizing method whereby the present input vector is predicted by using the result of the past quantization and an error of the predictive value to the input vector is quantized. For the relatively stable input vector series, the quantization distortion which is obtained by the conventional quantizer/inverse-quantizer continues as an almost constant value and does not decrease further. However, as compared with its, according to the quantizer/inverse-quantizer using the predictive error vector quantizing method, the quantization distortion gradually decreases with the elapse of time. From the above fact, for the input vector series having few changes, the quantizer/inverse-quantizer using the predictive error vector quantizing method can be regarded as better. However, for the input vector series which greatly change, the quantizer/inverse-quantizer using the predictive error vector quantizing method gives a larger quantization distortion as compared with that of the conventional quantizer/inverse-quantizer and have a drawback such that in many cases, the average quantization distortion for various input vectors finally becomes large.

On the other hand, when considering the case of simultaneously compressing auxiliary information such as amplitude information or the like, in addition to the input vector, as in the conventional example, there is a case where the change in auxiliary information is small and there is no need to particularly transmit it. In such a case, it is considered to be effective that the information amount which is used for the auxiliary information is added and used for quantization of the input vector. However, in the conventional quantizer/inverse-quantizer, since the input vector and the auxiliary information are independently quantized, the optimum quantization according to the input as mentioned above, cannot be executed.

On the other hand, if a large number of learning input vectors can be preliminarily obtained, by previously obtaining the optimum code table for the learning input vectors, a high efficient vector quantization can be realized. Conversely, if the learning input vectors cannot be previously obtained, it is necessary to use a method whereby the optimum code table is obtained as the vector to be quantized is inputted. Such a method is called an adaptation of the code table. For instance, in the case of quantizing the spectral feature parameter vector of the voice, many voices generated by a number of speakers are analyzed and a set of spectral feature parameter vectors are obtained, and the optimum code table is obtained from those vectors by using a method called a clustering method. In such spectral feature parameters, since the difference of the correlation among the components is large for every speaker, if the optimum code table is previously obtained for each speaker, the quantizing efficiency is fairly good. However, it is practically impossible to prepare individual code tables for all of the speakers. Even in such a case, it is also effective to use the adaptation of the code tables such that a common code table which was obtained from a number of speakers is first used and is then gradually adapted to the present speakers.

As a typical example of the adaptive method of the code table, the following literature 2 is known.

Yoshinao Shiraki and Masaaki Honda, "The Application of the Segment Movement Vector Quantizing Method to the Adaptation to Speaker", Acoustical Society of Japan, papers of the lecture of Spring Study Publishment Conference, pp. 123-124, 1988.

In the literature 2, code table updating information comprising segment movement vectors is calculated by using a set of about 100 to 1000 input vectors and the adapting process of the common code table is executed by using it.

FIG. 7 shows a construction of an input adaptive type quantizer disclosed in the literature 2. In the diagram, reference numeral 31 denotes a quantizer; 33 a vector input terminal; 34 a code table comprising a limited number (N) of code words which were calculated by using the voices of a number of speakers; 37 vector quantizing means; 40 analyzing means; 41 converting means; and 42 a code number transmission path. The operations of the above conventional example will now be described. First, the input vector X is inputted to the vector quantizing means 37 and analyzing means 40 in the quantizer 31 through the vector input terminal 33. The analyzing means 40 analyzes the past input vectors and calculates the segment movement vectors to make the code table 34 adapted for the past input vectors and outputs to the converting means 41. The vector quantizing means 37 calculates the distances $\{d(X, C_i')|i=1,\ldots,N\}$ between the input vector X and the code words $\{C_i'|i=1,\ldots,N\}$ which are obtained by converting the N code words $\{C_i|i=1,\ldots,N\}$ in the code table 34 by the converting means 41, respectively, and outputs the code number of the optimum vector code word which gives the minimum distance among them to the code number transmission path 42. The distance function d defines the value to be minimized upon execution of the vector quantization and an absolute value distance, a Euclid distance, or the like is used.

Since the conventional adapting process of the code table uses the input vector itself for analysis, such a process can only be used in the quantizer. In order to allow the inverse-quantizer to have the same adapted code table as that of the quantizer, the result obtained by the analyzing means 40 must be transferred to the inverse-quantizer by some method and the information for adaptation needs to be newly transmitted. There is a drawback such that the conventional adapting process is not suitable for the real-time process as in the voice communication. By analyzing the result of the quantization and obtaining the information for adaptation instead of the input vector itself, simultaneous adaptation for the quantizer and inverse-quantizer can be accomplished. However, in this case, there is a subject such that not only the adaptation speed is slow but also the characteristics of the quantizer after completion of the adaptation are not improved by very much.

SUMMARY OF THE INVENTION

It is an object of the present invention to eliminate the above subjects and to obtain quantizer/inverse-quantizer having an average quantization distortion smaller than that in the conventional method.

Another object of the invention is to eliminate the above subjects and to enable the code tables of quantizer and inverse-quantizer to be optimally adapted without, particularly, adding the information transmitting process for adaptation.

Quantizer/inverse-quantizer according to the present invention comprise: code tables which are constructed by M vector code words and N-M predictive error vector code words; vector quantizing means/inverse-vector quantizing means; predictive error vector quantizing means/inverse-predictive error vector quantizing means; and comparing means for deciding which one of quantization distortions obtained by the vector quantizing means and predictive error vector quantizing means is smaller.

On the other hand, in the case of simultaneously compressing the information amounts of the input vector and auxiliary information, in addition to the above means, there are further provided: discriminating means for obtaining the distortion between the predictive value of the auxiliary information obtained, by using the result of the quantization of the past auxiliary information and the present auxiliary information, and for comparison with a predetermined threshold value; predictive error vector quantizing means for obtaining an optimum predictive error vector code word and a gain coefficient which are suitable for minimizing the quantization distortion between the result which is obtained by multiplying the predictive error vector code word by an arbitrary gain coefficient and the predictive error vector which is obtained in the quantizer when the discriminating means determines that the distortion is smaller than the predetermined threshold value; and, further, auxiliary information quantizing means for quantizing the gain coefficient in place of the auxiliary information and outputting to the inverse-quantizer in the case where the comparing means selected the optimum predictive error vector code word.

In the quantizer according to the invention, the quantization distortion in the case where the optimum vector code word was used and the quantization distortion in the case where the optimum predictive error vector code word was used are compared by the comparing means, thereby selecting which one of the conventional vector quantization and the predictive error vector quantization should be executed for the present input vector. On the other hand, the inverse-quantizer selects either one of the inverse-quantizations in accordance with the input code number from the vector code.

Further, input adaptive type quantizer/inverse-quantizer according to the invention are constructed in the following manner. The quantizer comprises: a code table which is constructed by M vector code words and N-M predictive error vector code words; vector quantizing means; predictive error vector quantizing means; selecting means for selecting which one of the code words obtained by the vector quantizing means and the predictive error vector quantizing means should be used; analyzing means for analyzing the result of the past quantization and for extracting the information to make the code table adaptive to the input; and converting means for converting the M vector code words by using the information. The inverse-quantizer has the same code table, analyzing means, and converting means as those in the quantizer; inverse-vector quantizing means; an inverse-predictive error vector quantizing means; and control means to enable one of the two inverse-vector quantizing means to be used on the basis of the code number.

According to the invention, the quantizer and the inverse-quantizer have the same analyzing means and converting means and execute the adaptation of the code table by using the result of the quantization. Thus, the adaptation of the code tables of the quantizer and inverse-quantizer can be executed, particularly, without adding the the information transmitting process for adaptation. On the other hand, by executing the quantization by selectively using the predictive error vector quantizing means, the accuracy of the result of the quantization is improved and a good adaptation of the code table is realized.

DETAILED DESCRIPTION OF THE PREFERRED EMBODIMENTS

Figure 1:
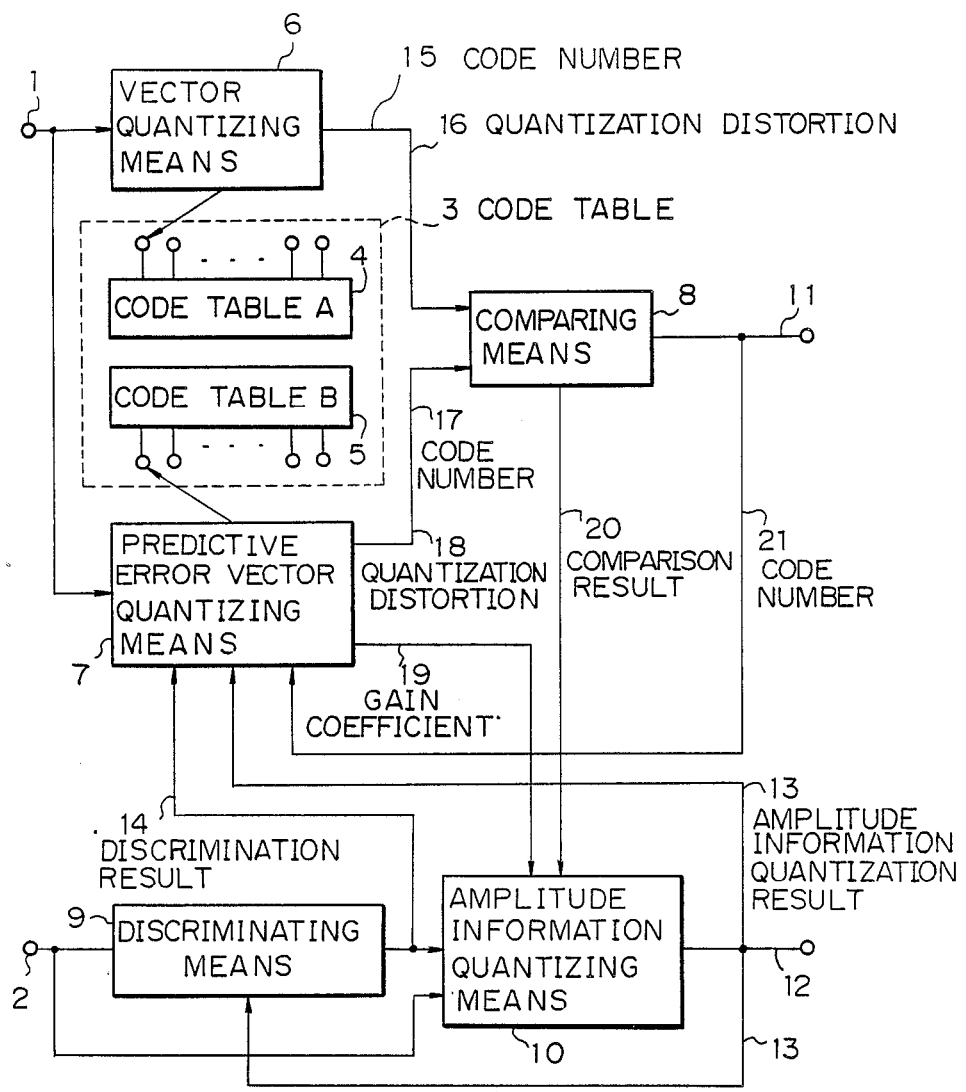
FIG. 1 is a block diagram showing a quantizer in an embodiment of the present invention.
Figure 2:
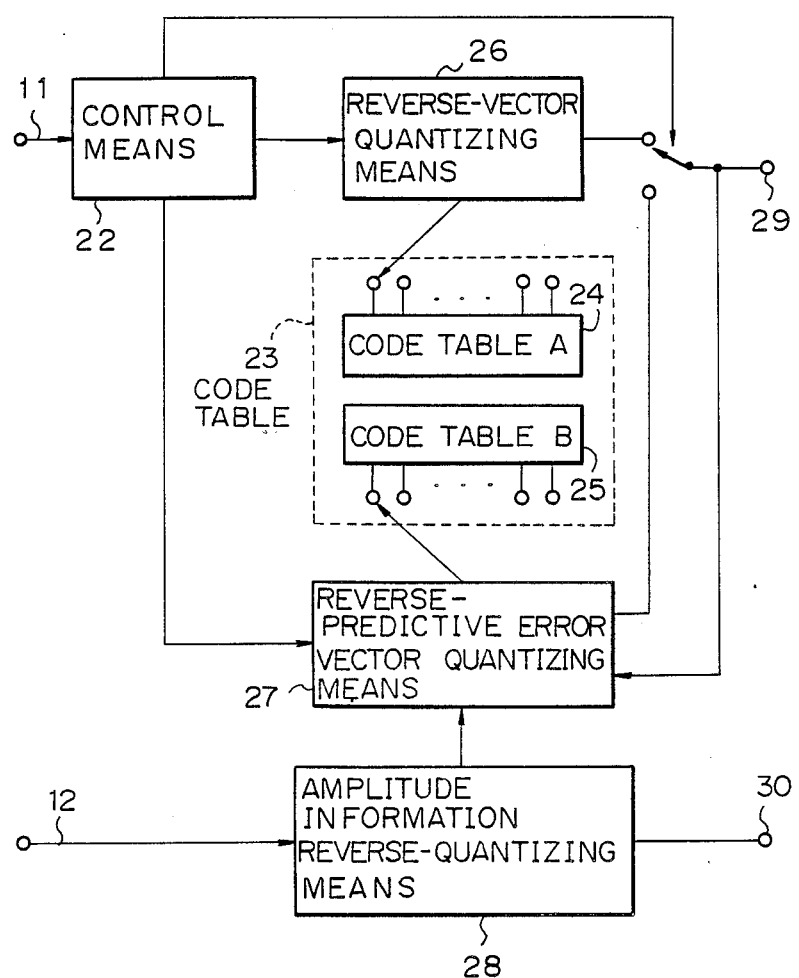
FIG. 2 is a block diagram showing an inverse-quantizer in the embodiment of the invention.
Figure 5:
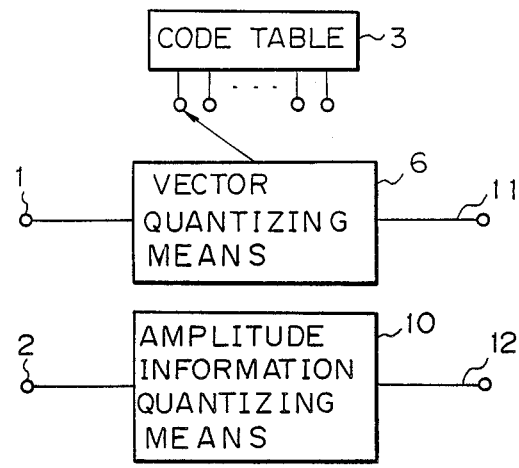
FIG. 5 is a block diagram showing a conventional quantizer.
Figure 6:
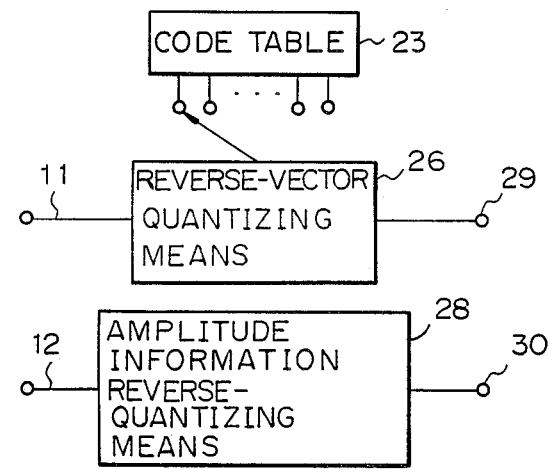
FIG. 6 is a block diagram showing a conventional inverse-quantizer.
Figure 7:
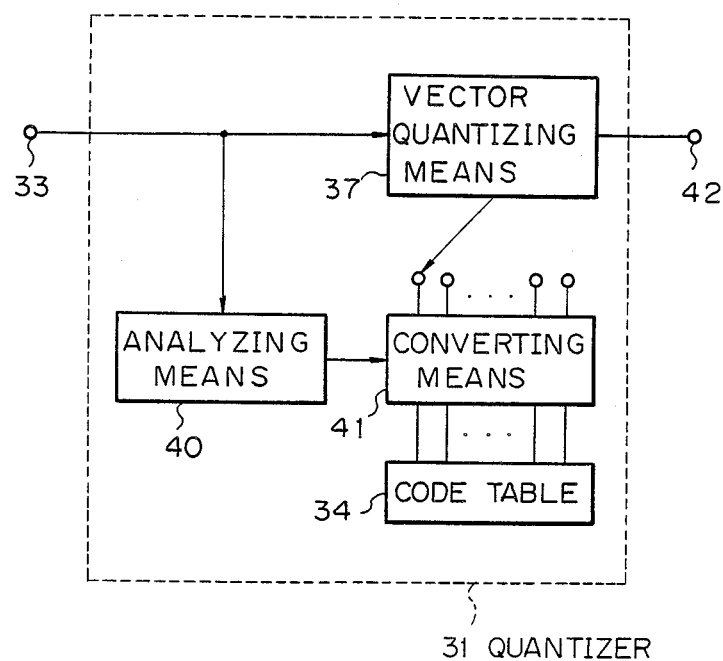
FIG. 7 is a block diagram showing a conventional vector quantizer.

An embodiment of the present invention will be described hereinbelow with reference to FIGS. 1 and 2. In FIGS. 1 and 2, the same parts and components as those shown in FIGS. 5 and 6 are designated by the same reference numerals. FIG. 1 is a block constructional diagram of a quantizer and FIG. 2 is a block constructional diagram of an inverse-quantizer. In the diagrams, reference numerals 4 and 24 denote code tables A each comprising M (positive integer) vector code words; 5 and 25 indicate code tables B each comprising N-M predictive error vector code words; 7 predictive error vector quantizing means; 8 comparing means; 9 discriminating means; 13 a result of the quantization of amplitude information; 14 a result of the discrimination; 15, 17, 21 code numbers; 16 and 18 quantization distortions; 19 a gain coefficient; 20 a result of the comparison; 22 control means; and 27 inverse-predictive error vector quantizing means.

First, an input vector is inputted to the vector quantizing means 6 and predictive error vector quantizing means 7 through the input vector input terminal 1, and amplitude information is inputted to the discriminating means 9 and amplitude information quantizing means 10 through the amplitude information input terminal 2. The discriminating means 9 obtains the predictive value of the present amplitude information by using the quantization result 13 of the past amplitude information, thereby obtaining the predictive error between the predictive value and the input amplitude information. The predictive error is compared with a predetermined threshold value. The discrimination result 14 is outputted to the predictive error vector quantizing means 7 and amplitude information quantizing means 10. On the other hand, the vector quantizing means 6 calculates the distances $\{d(X, C_i) | i=1, \ldots, M\}$ between the M vector code words $\{C_i | i=1, \ldots M\}$ in the code table-A 4 and the input vector X and outputs the code number 15 of the optimum vector code word which gives the minimum distance among them, and the minimum distance at that time as a quantization distortion 16 to the comparing means 8. On the other hand, the predictive error vector quantizing means 7 obtains a predictive value $X_p$ of the present input vector by using the quantization results of the past input vectors which are expressed by the code numbers 21 and the quantization results 13 of the amplitude information which were transmitted until the present processing time point, thereby calculating a predictive error vector $X_e$ between the predictive value $X_p$ and the input vector X. When the predictive error of the amplitude information as the discrimination result 14 which was inputted from the discriminating means 9 is a threshold value or more, the distances $\{d(X_e, C_i) | i=M+1, \ldots, N\}$ between the N-M predictive error vector code words $\{C_i | i=M+1, \ldots, N\}$ in the code table-B 5 and the predictive error vector $X_e$ are calculated. The code number 17 of the optimum predictive error vector code word which gives the minimum distance among them and the minimum distance at that time are outputted as a quantization distortion 18 to the comparing means 8. If the predictive error of the amplitude information as the discrimination result 14 which was inputted from the discriminating means 9 is smaller than the threshold value, the distances $\{d_g(X_e, C_i) | i=M+1, \ldots, N\}$ with gains between the N-M predictive error vector code wards $\{C_i | i=M+1, \ldots, N\}$ in the code table-B 5 and the predictive error vector $X_e$ and the gain coefficients $\{g(X_e, C_i) | i=M+1, \ldots, N\}$ are calculated on the basis of the following equations (1) and (2). The code number 17 of the optimum predictive error vector code word which gives the minimum distance among them and the minimum distance at that time are outputted as the quantization distortion 18 to the comparing means 8. The gain coefficient 19 for the code word is outputted to the amplitude information quantizing means 10. If the Euclid distance is used as a distance function d, the equation (1) is fairly simplified and its solution can be easily obtained.

$$\frac{\partial}{\partial g} d(X_e, g^*C_i) \bigg|_g = g(X_e, C_i) = 0 \quad (1)$$

$$d_g(X_e, C_i) = d(X_e, g^*C_i) \quad (2)$$

The comparing means 8 compares the two quantization distortions 16 and 18 which were inputted from the vector quantizing means 6 and predictive error vector quantizing means 7 and outputs the comparison result 20 to the amplitude information quantizing means 10. Further, the comparing means 8 outputs the code number 21 which gives the small quantization distortion to the predictive error vector quantizing means 7 and code number transmission path 11. When the predictive error of the amplitude information as the discrimination result 14 which was inputted from the discriminating means 9 is smaller than the threshold value and when the comparison result 20 which was inputted from the comparing means 8 indicates the selection of the optimum prediictive error vector code word, the amplitude information quantizing means 10 quantizes the gain coefficient 19, which was input-ted from the predictive error vector quantizing means 7, and outputs as the amplitude information quantization result 13 to the discriminating means 9 and quantization amplitude information transmission path 12, together with additional information, indicating that the quantized information is the gain coefficient. In case other than the above case, the amplitude information quantizing means 10 quantizes the amplitude information and outputs as the amplitude information quantization result 13 to the discriminating means 9 and quantization amplitude information transmission path 12 together with additional information indicating that the quantized information is the amplitude information.

When the quantization information which was inputted through the quantization amplitude information transmission path 12 is the amplitude information, the amplitude information inverse-quantizing means 28 in the inverse-quantizer (FIG. 2) inverse-quantizes it and outputs to the amplitude information output terminal 30. If the inputted quantization information is the gain coefficient, the predictive value of the present amplitude information is obtained from the past quantization amplitude information and is outputted to the amplitude information output terminal 30. The inverse-quantized gain coefficient is outputted to the inverse-predictive error vector quantizing means 27. If the code number which was inputted through the code number transmission path 11 designates the code word in the code table-A 24, the control means 22 outputs the code number to the inverse-vector quantizing means 26. If the code number designates the code word in the code table-B 25, the control means 22 outputs the code number to the inverse-predictive error vector quantizing means 27. The inverse-vector quantizing means 26 reads out the vector code word in the code table-A 24 which is designated by the inputted code number and outputs to the output vector output terminal 29. The inverse-predictive error vector quantizing means 27 reads out the predictive error vector code word in the code table-B 25 which is designated by the inputted code number and obtains the predictive value of the present input vector by using the quantization result of the past input vector. If no gain coefficient is inputted from the amplitude information inverse-quantizing means 28, the result in which the predictive value of the input vector was added to the predictive error vector code word is outputted to the output vector output terminal 29. When the gain coefficient is inputted from the amplitude information inverse-quantizing means 28, the result in which the predictive value of the input vector was added to the value which was obtained by multiplying the predictive error vector code word by the gain coefficient is outputted to the output vector output terminal 29.

The above embodiment has been described with respect to the example in which when it is determined that the quantization of the amplitude information is unnecessary, the gain coefficient is quantized and outputted to the inverse-quantizer. However, if there is no auxiliary information of the input vector such as amplitude information or the like, the parts and components shown by reference numerals 2, 9, 10, 12, 13, 14, 19, 20, 28 and 30 in the above embodiment are eliminated. On the other hand, it is also possible to be constructed such that the gain coefficient is always quantized and used. The average quantization distortion can be further improved by providing a predictive error vector quantizing means in which, for instance, the predictive conditions differ or the like as another quantizing means in addition to the conventional vector quantizing means and predictive error vector quantizing means, and by providing the code word according to the quantizing means which is newly added into the code table.

Figure 3:
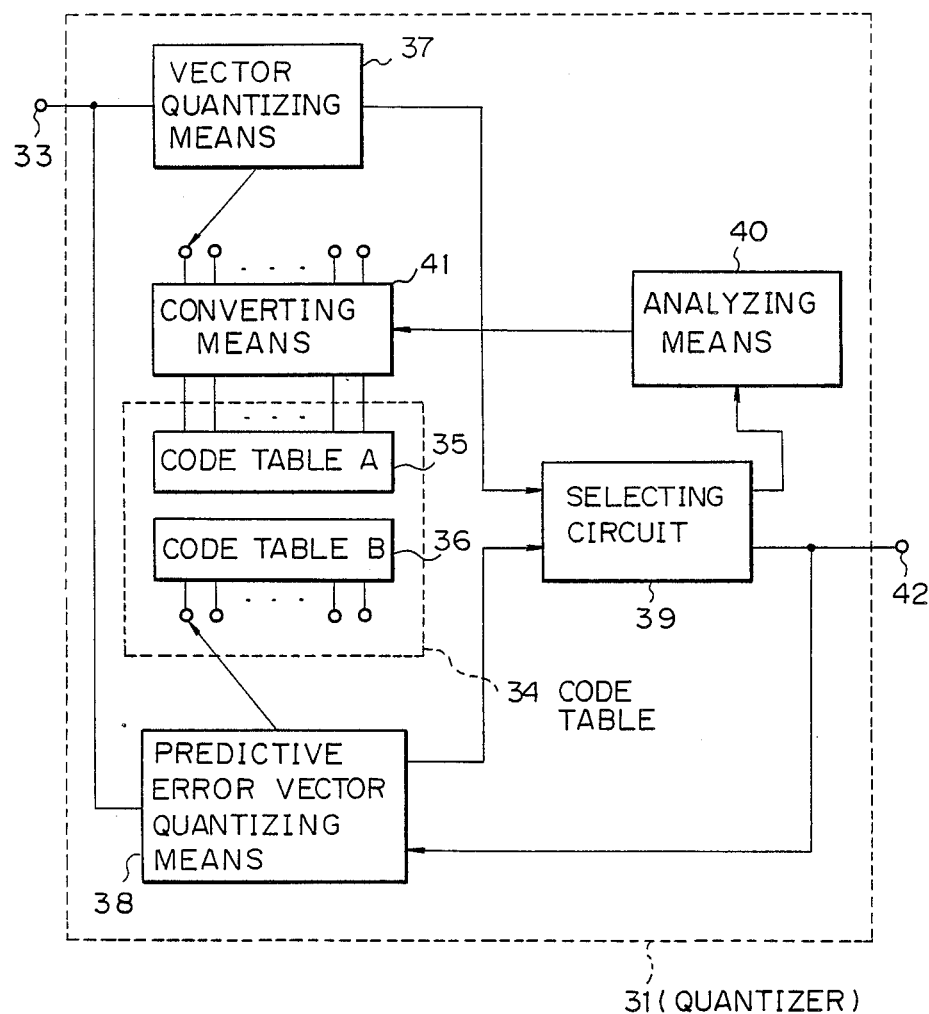
FIG. 3 is a block diagram showing a quantizer in the embodiment of the invention.
Figure 4:
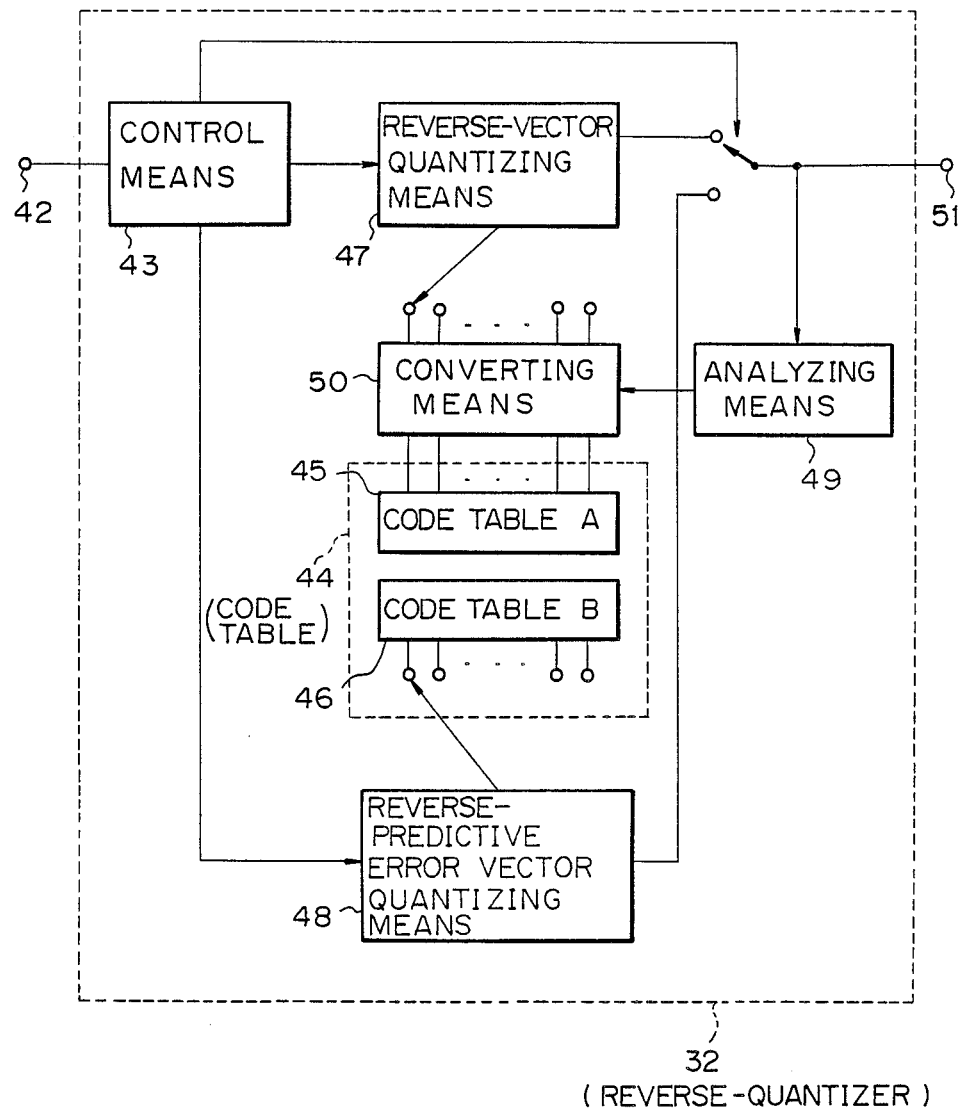
FIG. 4 is a block diagram showing an inverse-quantizer in the embodiment of the invention.

An embodiment of the invention will now be described with reference to FIGS. 3 and 4. In the diagrams, reference numeral 31 denotes the quantizer; 32 indicates an inverse-quantizer; 33 the vector input terminal; 34 and 44 code tables each comprising the limited number (N) of code words; 35 and 45 code tables A each comprising M (positive integer) vector code words; 36 and 46 code tables B each comprising N-M predictive error vector code words; 37 the vector quantizing means; 38 predictive error vector quantizing means; 39 selecting means; 40 and 49 analyzing means; 41 and 50 converting means; 42 the code number transmission path; 43 control means; 47 inverse-vector quantizing means; 48 inverse-predictive error vector quantizing means; and 51 a vector output terminal.

First, the input vector X is inputted to the vector quantizing means 37 and predictive error vector quantizing means 38 through the vector input terminal 33. The vector quantizing means 37 calculates the distances $\{d(X, C_i') | i=1, \ldots, M\}$ between the code words $\{C_i' | i=1, \ldots, M\}$ which are obtained by converting the M vector code words $\{C_i | i=1, \ldots, M\}$ in the code table-A 35 by the converting means 41 and the input vector X. The code number of the optimum vector code word which gives the minimum distance among them and the minimum distance at that time, are outputted as a quantization distortion to the selecting means 39. On the other hand, the predictive error vector quantizing means 38 obtains the predictive value $X_p$ of the present input vector by using the quantization results of the past input vectors, thereby calculating the predictive error vector $X_e$ between the predictive value $X_p$ and the input vector X. The distances $\{d(X_e, C_i) | i=M+1, \ldots, N\}$ between the N-M predictive error vector code words $\{C_i | i=M+1, \ldots, N\}$ in the code table-B 36 and the predictive error vector $X_e$ are calculated. The code number of the optimum predictive error vector code word which gives the minimum distance among them and the minimum distance at that time are outputted as a quantization distortion to the selecting means 39. The selecting means 39 selects one of the two code words which were inputted from the vector quantizing means 37 and the predictive error vector quantizing means 38 and outputs the selected code number to the predictive error vector quantizing means 38 and the code number transmission path 42. The inverse-quantization result which is obtained in the inverse-quantizer 32 in the case where the code word was transmitted is calculated and is outputted as the quantization result to the analyzing means 40. As an example of a method for the above selection, there is a method whereby the two quantization distortions which were inputted from the vector quantizing means 37 and the predictive error vector quantizing means 38 are compared, and the code number which gives the small quantization distortion is selected. The analyzing means 40 analyzes the past quantization result and extracts the information for adaptation of the code table and outputs to the converting means 41.

When the code number which was inputted through the code number transmission path 42 designates the code word in the code table-A 45, the control means 43 in the inverse-quantizer 32 outputs the code number to the inverse-vector quantizing means 47. When the code number designates the code word in the code table-B 46, the control means 43 outputs the code number to the inverse-predictive error vector quantizing means 48. The inverse-vector quantizing means 47 transfers the vector code word in the code table-A 45 which is designated by the inputted code number to the converting means 50 and outputs the result of the conversion by the converting means 50 to the analyzing means 49, inverse-predictive error vector quantizing means 48, and vector output terminal 51. The inverse-predictive error vector quantizing means 48 reads out the predictive error vector code word in the code table-B 46 which is designated by the inputted code number and obtains the predictive value of the present input vector by using the quantization result of the past input vectors. The result in which the predictive value of the input vector was added to the predictive error vector code word is outputted to the analyzing means 49 and the vector output terminal 51. The analyzing means 49 analyzes the past quantization result and extracts the information for adaptation of the code table and outputs to the converting means 50.

As an example of the analyzing means 40 and 49 and the converting means 41 and 50, the quantization results of hundreds of past frames are used as the learning vector series and the adaptation algorithm of the literature 2 can be applied. That is, the vector code words in the code table A are divided into a few to tens of segments each comprising the vector code words existing at near distances and the segment movement vectors for the adaptation of each segment are calculated for the learning vector series. The movement vector for each code word is obtained as the linear sum of them and used in the converting means, so that the adaptation can be accomplished.

In the embodiment, in addition to the vector quantizing means and predictive error vector quantizing means, for instance, predictive error vector quantizing means in which the predictive conditions differ or the like is further provided as another quantizing means and, at the same time, the code words according to the quantizing means which is newly added are provided in the code table. With such a construction, the adapting characteristics can be further improved.

If the gain coefficients in the predictive error vector quantization are transmitted as auxiliary information, the quantization distortion can be further reduced and the adapting characteristics can be further improved.

In the above embodiment, the ratio of the numbers of vector code words in the code tables A and B is held to a constant value and the adaptation of the code table A has been executed. However, the adaptation can be also realized by gradually increasing the number of code words in the code table A as the input is given.

As mentioned above, according to the present invention, the conventional selection between the vector quantizing means and the predictive vector quantizing means is automatically executed in accordance with the input vector and the quantizer/inverse-quantizer of the small average quantization distortion for various input vector series can be realized. On the other hand, if the characteristics of the input vector series are already known to a certain degree, by selecting the optimum ratio between the number M of vector code words and the number N-M of predictive error vector code words, the optimum quantizer/inverse-quantizer can be realized.

In the case of simultaneously quantizing the auxiliary information, according to the invention, if the quantization of the auxiliary information can be regarded as unnecessary, a remaining information amount can be used to quantize the input vector and the quantizing characteristics as a whole quantizer can be further improved.

Moreover, according to the invention, a good adaptation of the code tables of the quantizer and inverse-quantizer can be accomplished without adding, particularly, the information transmitting process for adaptation.

What is claimed is:

1. A quantizer and an inverse-quantizer for compressing an information amount using code tables each having a limited number (N) of code words, wherein
said quantizer comprises:
a code table which is constructed by M (M is a positive integer smaller than N) vector code words and (N-M) predictive error vector code words;
vector quantizing means for selecting an optimum vector code word which is closest to a present input vector to be quantized from among said M vector code words and for calculating its quantization distortion;
predictive error vector quantizing means for obtaining a predictive error vector between a predictive value of an input vector which was calculated from a quantization result of past input vectors and the present input vector, for selecting an optimum predictive error vector code word which is closest to the predictive error vector from among the (N-M) predictive error vector code words, and for calculating its quantization distortion; and
comparing means for selecting a code word which gives a smaller quantization distortion from said selected optimum vector code word and said selected optimum predictive error vector code words and for outputting a code number of said selected code word,
and wherein said inverse-quantizer comprises:
a code table which is constructed by M (M is a positive integer smaller than N) vector code words and (N-M) predictive error vector code words;

inverse-vector quantizing means which, when the code number inputted from said quantizer designates one code word among said M vector code words, outputs said designated one vector code word;

inverse-predictive error vector quantizing means which, when the code number inputted from the quantizer designates one code word among said (N-M) predictive error vector code words, outputs a result in which said designated one predictive error vector code word was added to the predictive value of the input vector; and control means for switching between said inverse-vector quantizing means and said inverse-predictive error vector quantizing means on the basis of said code number.

2. A quantizer and an inverse-quantizer according to claim 1 for simultaneously compressing an information amount of an input vector and an information amount of auxiliary information regarding said input vector, wherein said quantizer further comprises auxiliary information quantizing means for quantizing the auxiliary information and discriminating means for calculating a predictive value of the present auxiliary information by using past auxiliary information quantization results and for comparing the predictive error of said predictive value for the inputted present auxiliary information with a predetermined threshold value;

said predictive error vector quantizing means in the quantizer obtains the optimum predictive error vector code word in a manner similar to claim 1 when said discriminating means determines that the predictive error is the threshold value or more, while if the discriminating means decides that the predictive error is smaller than the threshold value, said predictive error vector quantizing means obtains the optimum predictive error vector code word and a gain coefficient such as to minimize the quantization distortion between the result in which the predictive error vector code word was multiplied with an arbitrary gain coefficient and the predictive error vector which is obtained in the quantizer;

said auxiliary information quantizing means quantizes said gain coefficient and outputs to said inverse-quantizer without quantizing the auxiliary information when said discriminating means determines that the predictive error is smaller than the threshold value and, further, when the comparing means in the quantizer selects the optimum predictive error vector code word;

said inverse-quantizer further comprises auxiliary information inverse-quantizing means for inverse-quantizing the auxiliary information when the auxiliary information was inputted, for inverse-quantizing the gain coefficient when the gain coefficient was inputted in place of the auxiliary information, for outputting the result of said inverse-quantization to the inverse-predictive error vector quantizing means, for calculating the predictive value of the auxiliary information, and for outputting said calculated predictive value; and the inverse-predictive error vector quantizer in the inverse-quantizer outputs the result in which the value which had been obtained by multiplying said designated predictive error vector code word by the gain coefficient was added to the predictive value of the input vector when the inputted code number designates one of said (N-M) predictive error vector code words and when the gain coefficient was inputted.

3. Input adaptive type quantizer and inverse-quantizer for compressing an information amount by using code tables each having a limited number (N) of code words, wherein said quantizer comprises:

a code table which is constructed by M (M is a positive integer smaller than N) vector code words and (N-M) predictive error vector code words;

converting means for converting said M vector code words into code words adapted to past input vectors;

vector quantizing means for selecting an optimum vector code word which is closest to a present input vector to be quantized from among said converted M vector code words and for calculating its quantization distortion;

predictive error vector quantizing means for obtaining a predictive error vector between a predictive value of an input vector which was calculated from a quantization result of past input vectors and the present input vector, for selecting an optimum predictive error vector code word which is closest to the predictive error vector from among the (N-M) predictive error vector code words, and for calculating its quantization distortion;

selecting means for selecting one of said optimum vector code word and said optimum predictive error vector code word which were selected; and analyzing means for calculating information for adaptation from the quantization result which is outputted from said selecting means and for updating said converting means, and wherein said inverse-quantizer comprises:

a code table which is constructed by M (M is a positive integer smaller than N) vector code words and (N-M) predictive error vector code words;

a converting means for converting said M vector code words into code words adapted to past input vectors;

inverse-vector quantizing means which, when the code number inputted from said quantizer designates one code word among said M vector code words, outputs a code word which is obtained by converting said designated one vector code word by said converting means;

inverse-predictive error vector quantizing means which, when the code number inputted from the quantizer designates one code word among said (N-M) predictive error vector code words, outputs a result in which said designated one predictive error vector code word was added to the predictive value of the input vector;

selecting means for selecting one of said inverse-vector quantizing means code word and said inverse-predictive error vector quantizing means result;

analyzing means for calculating information for adaptation from the quantization result which is outputted from said selecting means and for updating said converting means; and control means for interpreting said code number and instructing operations to said inverse-vector quantizing means and said inverse-predictive error vector quantizing means.

* * * * *